(12) United States Patent
Charbuillet et al.

(10) Patent No.: US 8,871,606 B2
(45) Date of Patent: Oct. 28, 2014

(54) MICROELECTROMECHANICAL DEVICE PACKAGING WITH AN ANCHORED CAP AND ITS MANUFACTURE

(75) Inventors: Clement Charbuillet, Chambery (FR); Laurent Gosset, Toulouse (FR)

(73) Assignees: STMicroelectronics (Crolles 2) SAS, Crolles (FR); Koninklijke Philips Electronics, N.V., Eindhoven (NL)

( * ) Notice: Subject to any disclaimer, the term of this patent is extended or adjusted under 35 U.S.C. 154(b) by 1442 days.

(21) Appl. No.: 11/991,041

(22) PCT Filed: Aug. 24, 2006

(86) PCT No.: PCT/EP2006/008307
§ 371 (c)(1),
(2), (4) Date: Jul. 20, 2009

(87) PCT Pub. No.: WO2007/022978
PCT Pub. Date: Mar. 1, 2007

(65) Prior Publication Data
US 2010/0001368 A1 Jan. 7, 2010

(30) Foreign Application Priority Data
Aug. 26, 2005 (EP) .................... 05291789

(51) Int. Cl.
*B81B 7/00* (2006.01)
*B81C 1/00* (2006.01)

(52) U.S. Cl.
CPC ................ *B81C 1/00238* (2013.01)
USPC ...................................... 438/421

(58) Field of Classification Search
USPC .............. 257/414, 522, E21.573, E29.018; 438/421
See application file for complete search history.

(56) References Cited

U.S. PATENT DOCUMENTS

| 5,455,547 A | * | 10/1995 | Lin et al. ................ 333/186 |
| 6,809,412 B1 | * | 10/2004 | Tourino et al. ............ 257/678 |
| 6,822,304 B1 | * | 11/2004 | Honer .................... 257/418 |
| 2004/0245586 A1 | * | 12/2004 | Partridge et al. ........... 257/414 |

FOREIGN PATENT DOCUMENTS

WO  WO 2004/037711 A2   5/2004

OTHER PUBLICATIONS

Written Opinion, Feb. 26, 2010, in PCT/EP2006/008307.*
Bharat Shivkumar et al., "Microrivets for MEMS Packaging: Concept, Fabrication, and Strength Testing," Journal of Microelectromechanical Systems, vol. 6, No. 3, Sep. 1997, pp. 217-225.
James D. Plummer, et al., "Silicon VLSI Technology, Fundamentals, Practice and Modeling", 2003, p. 20-45.

* cited by examiner

*Primary Examiner* — Thomas L Dickey
(74) *Attorney, Agent, or Firm* — Gardere Wynne Sewell LLP

(57) ABSTRACT

Integrated circuit (1) comprising a substrate (2), an active component (13) above the substrate (2), a cavity (14) surrounding partially the active component (13), a low dielectric region (15) surrounding partially the cavity (14) and a protective barrier (16) arranged around the low dielectric region (15).

13 Claims, 15 Drawing Sheets

MICROELECTROMECHANICAL DEVICE PACKAGING WITH AN ANCHORED CAP AND ITS MANUFACTURE

CROSS-REFERENCE TO RELATED APPLICATION(S)

Figure 1:
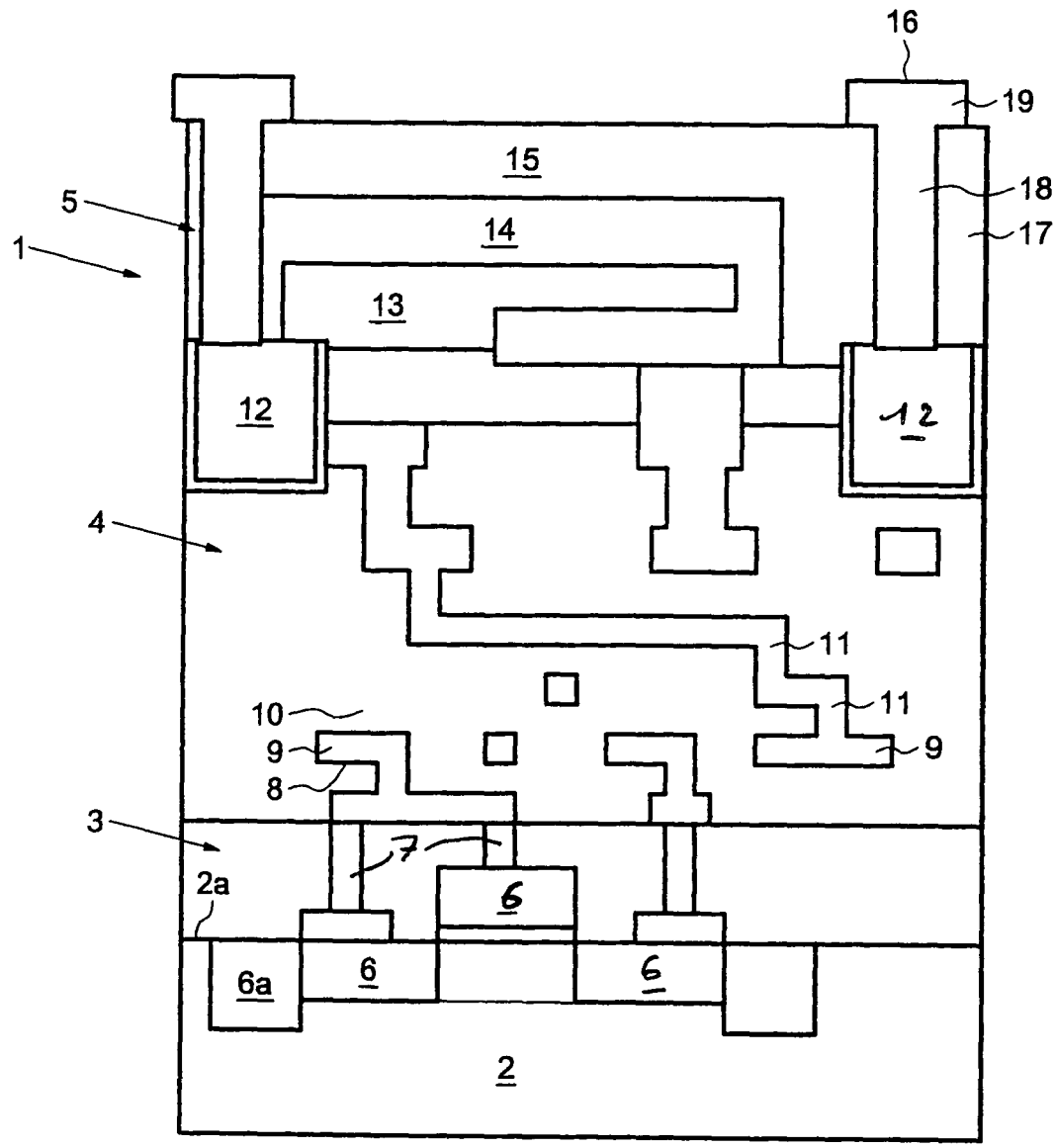

The present application is related to European Patent Application No. 05291789.5 filed Aug. 26, 2005, entitled "MICROELECTROMECHANICAL DEVICE PACKAGING WITH AN ANCHORED CAP AND ITS MANUFACTURE". European Patent Application No. 05291789.5 is assigned to the assignee of the present application and is hereby incorporated by reference into the present disclosure as if fully set forth herein. The present application hereby claims priority under 35 U.S.C. §119(a) to European Patent Application No. 05291789.5.

The invention relates to integrated circuits and particularly to integrated circuits provided with a component having a part capable of moving with regard to other components. Said component may be a micro-mechanical system, for example a resonator comprising a piezoelectric layer.

It is known to place such components above the highest level of metal interconnects, cf "Integrating Micromechanical Systems with Integrated Circuits" of Bryzek, Flannery & Skurnik in IEEE Instrumentation and Measurement Magazine June 2004, Volume 7, no 2, pages 51-59. It is desired to protect such components by an encapsulation.

The document FR A 2 851 373 concerns a process for fabricating an integrated circuit incorporating air gaps between interconnect elements so as to reduce the electrostatic and/or electromagnetic coupling effects. Air gaps are used as dielectrics.

A goal of the invention is to propose a solution for encapsulating a component within an integrated circuit.

Another goal of the invention is to obtain a compact integrated circuit manufactured at reduced costs, while having a high reliability.

In one exemplary embodiment, an integrated circuit comprises a substrate, an active component above the substrate, a cavity surrounding partially the active component, a low dielectric region surrounding partially the cavity and a protective barrier arranged around the low dielectric region.

With such an embodiment, it is possible to protect the interface between the low dielectric region and a support of the low dielectric region against lift off, particularly when the cavity is being formed.

The low dielectric region comprises an organic polymer, for example SiLK®. The organic polymer may be porous.

In one embodiment, the protective barrier is electrically conductive. The protective barrier may also be used as an electrical conductor, for example a via connecting two conductors of different levels.

The protective barrier may comprises metal, for example copper and/or tungsten.

In an other embodiment, the protective barrier is dielectric. The protective barrier may comprise SiC or SiCX, X being another species, for example O or N.

In one embodiment, the protective barrier comprises at least an internal cavity containing a gas. The internal cavity may filled with air. The internal cavity may be formed in a SiC region.

In one embodiment, the protective barrier comprises a plurality of vias.

In one embodiment, the protective barrier comprises at least a line.

In one embodiment, the protective barrier comprises an inner part comprising a first material and an outer part comprising a second material. The inner part may comprise a metal, for example copper or tungsten. The outer part may comprise a stop layer, for example SiC, TaN, Ta, TiN or Ti. The outer part may prevent diffusion of the material of the inner part in the low dielectric region or in the support.

In an other embodiment, the protective barrier comprises a single material. The protective barrier may comprise SiC or copper.

In one preferred embodiment, the protective barrier includes an upper portion and a base portion, the upper portion being larger than the base portion. The base portion may be at the level of the low dielectric region. The upper portion may be formed on the base portion and on a zone of the low dielectric region near the base portion. The protective barrier may form a plug securing the low dielectric region to a support, for example a substrate or an interconnect level.

In one embodiment, at least a part of protective barrier is in electrical contact with a conductive part of the substrate or of an interconnect level.

In one embodiment, the protective barrier is HF resistant. A cavity may be formed by using HF for removing a region comprising a HF removable material, for example a silicon glass (undoped or fluorinated), surrounded by the protective barrier.

In one embodiment, the active component lies on the substrate. The active component may be arranged between a substrate and an interconnect level. The active component may be arranged at the same level than a base or grid of a transistor.

In one embodiment, the circuit comprises at least an interconnect level supported by the substrate, the active component being supported by the interconnect level.

In one embodiment, the active component comprises a micro-mechanical system, for example a filter including a piezoelectric element.

In other terms, a logic device may include an active component, a support for supporting the active component, a low dielectric region surrounding the active component, and at least a rivet securing the dielectric region to the support, the dielectric region being apart from the active component.

The method of manufacturing an integrated circuit may comprise:
  forming an active component above a substrate,
  forming a low dielectric region above the substrate,
  forming a protective barrier around the low dielectric region
  forming a cavity surrounding partially the active component, the low dielectric region surrounding partially the cavity.

The barrier is capable of maintaining the low dielectric region. The barrier may also be capable of avoiding an undesirable effect of the step of forming a cavity outside the barrier.

In one embodiment, a removable region is formed around the active component and the low dielectric region is formed around the removable region. The low dielectric region may be formed on the removable region.

In one embodiment, the removable region comprises silicon glass. The silicon glass may be undoped or fluorinated. The silicon glass may be removed by a chemical attack through the low dielectric region. The removable region may be removed by a HF attack so as to form the cavity.

In one embodiment, forming the protective barrier comprises forming at least a trench in the low dielectric region.

In one embodiment, forming the protective barrier comprises depositing a thin dielectric layer in the trench and filling the remaining trench with a metal. The thin dielectric layer may prevent diffusion of the metal during subsequent steps. The thin dielectric layer is advantageous when the metal comprises copper.

In one embodiment, forming the protective barrier comprises at least partially filling the trench with a dielectric material.

In one embodiment, forming the protective barrier comprises forming an upper part larger than a base part, the upper part being above the low dielectric region, the base part being at the level of the low dielectric region. The protective barrier may be rivet like shaped or nail like shaped so as to retain the low dielectric region.

In one embodiment, the protective barrier is formed by a dual-damascene process. At least a stop layer having a good selectivity with regard to the low dielectric region may be formed. The stop layer may comprise SiN, SiON, SiC, SiCN, etc.

In one embodiment, the protective barrier comprises material resistant to the step of forming a cavity.

The device can be applicable to any electronic apparatus having a component capable of moving with regard to the remaining of the device. As an example, the device may be applied to a filter of cell phone.

Figure 2:
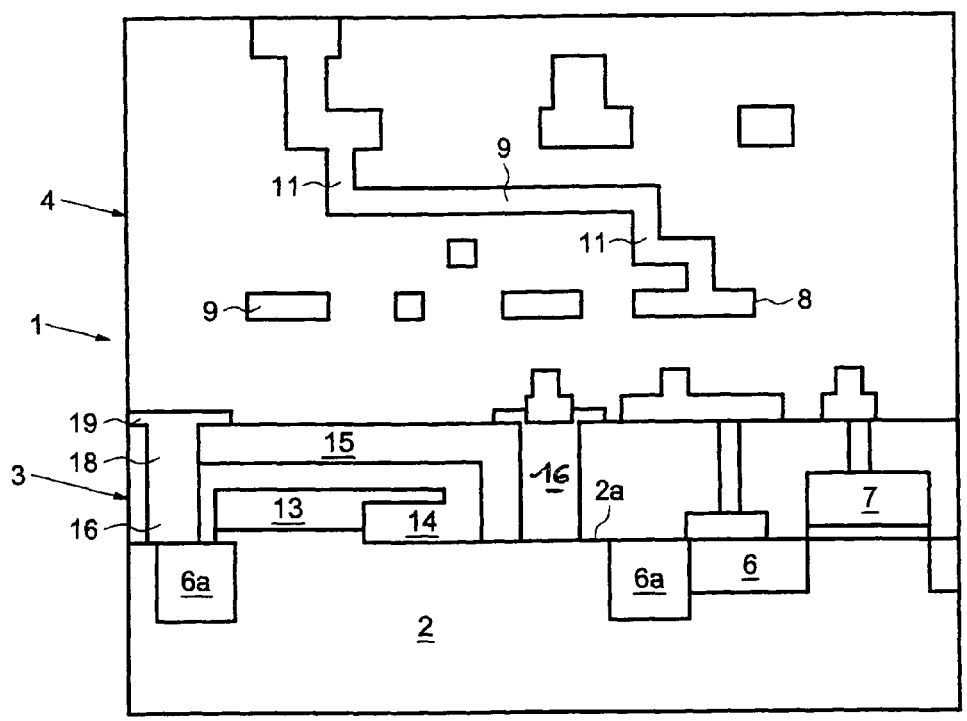
Figure 10:
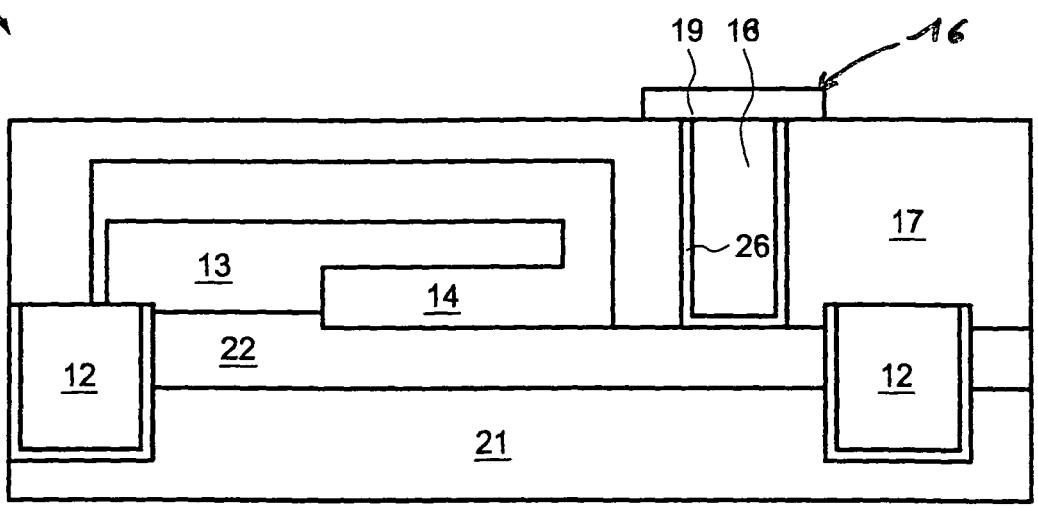
Figure 11:
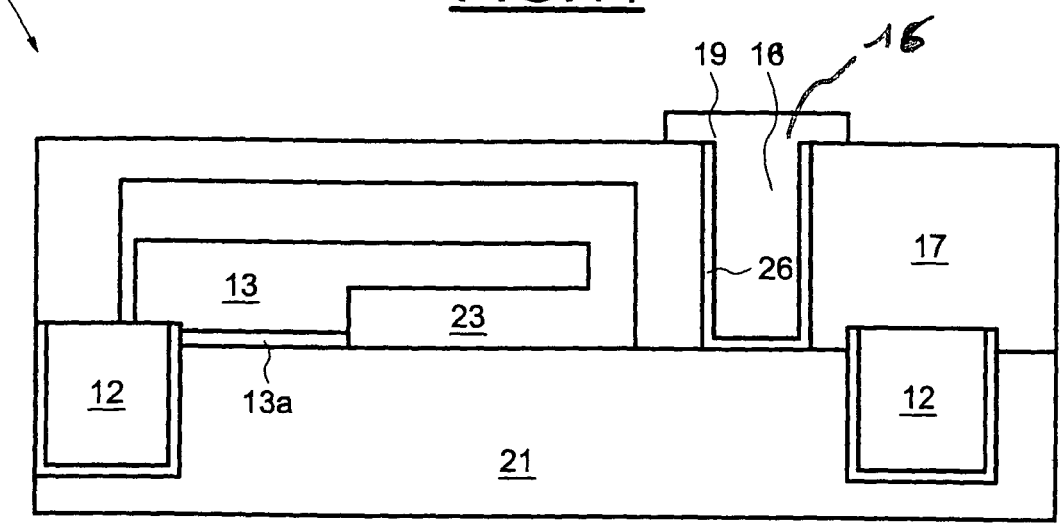
Figure 12:
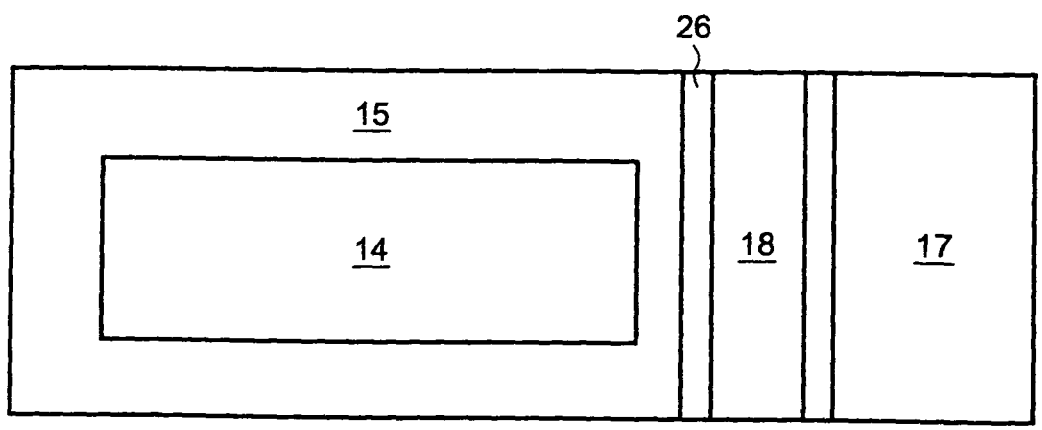
Figure 13:
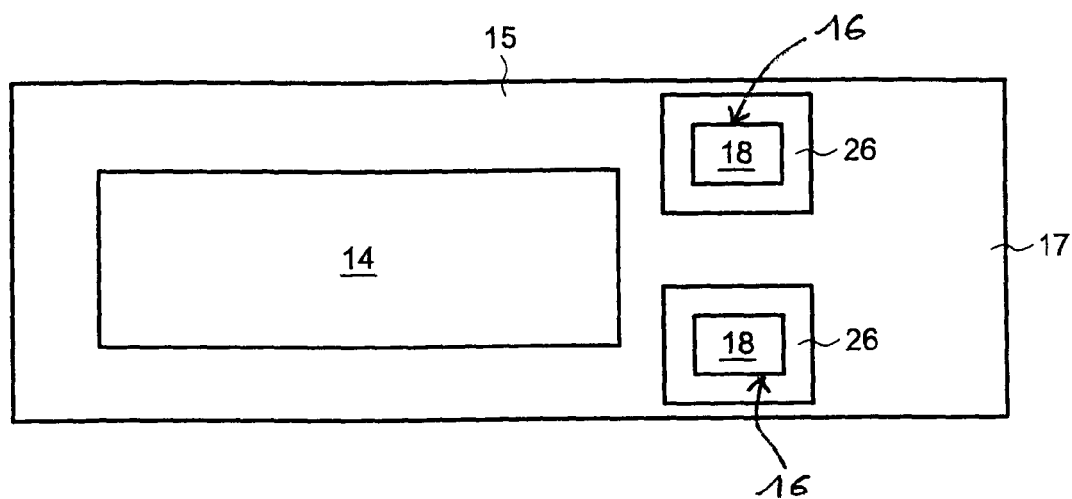
Figure 14:
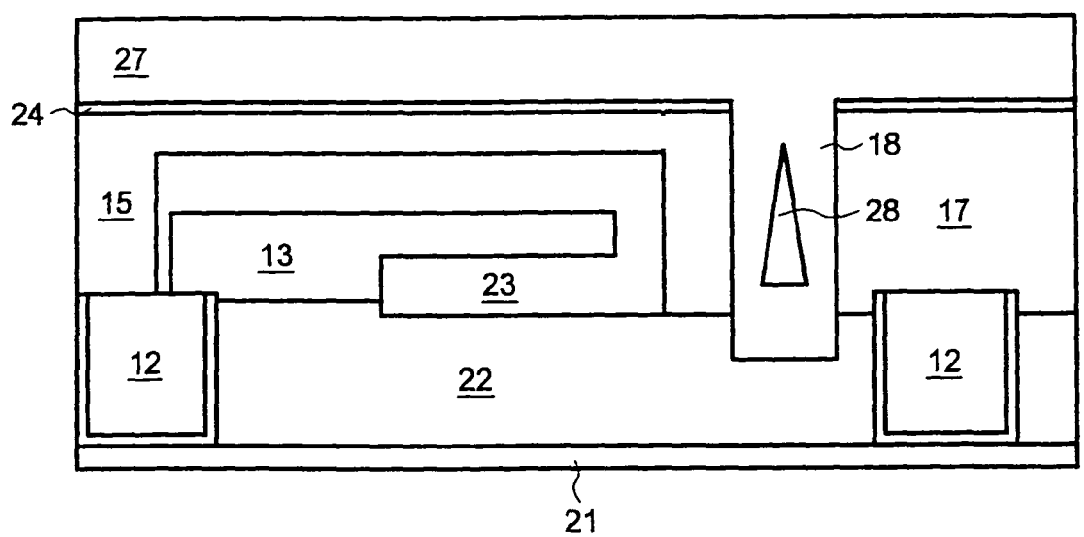
Figure 15:
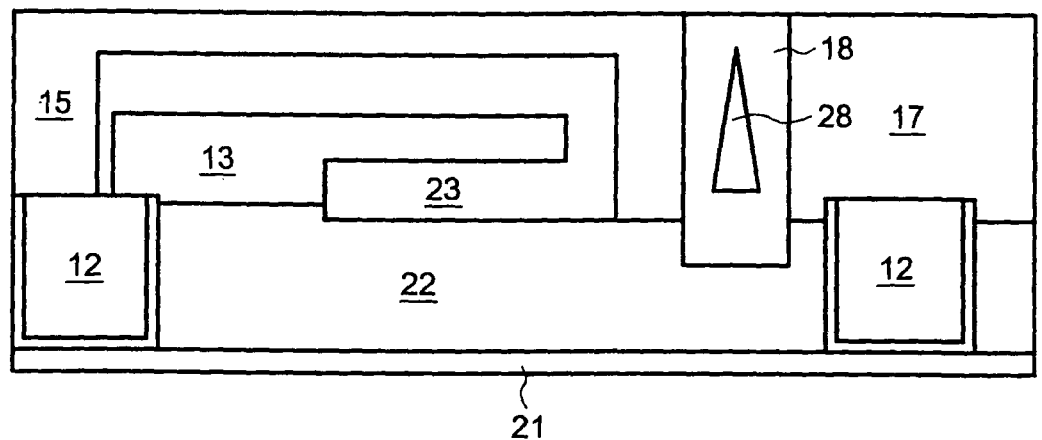
Figure 18:
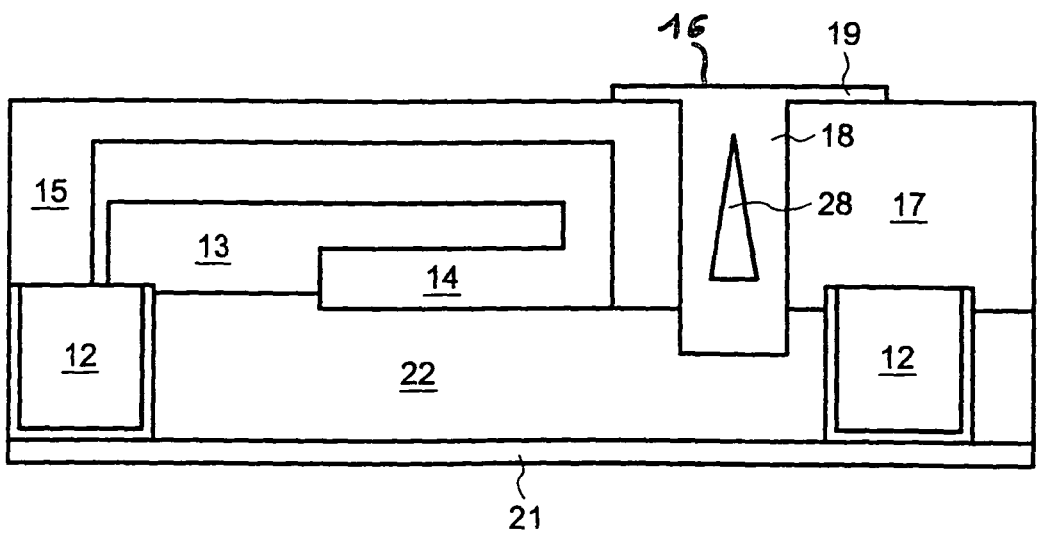
Figure 19:
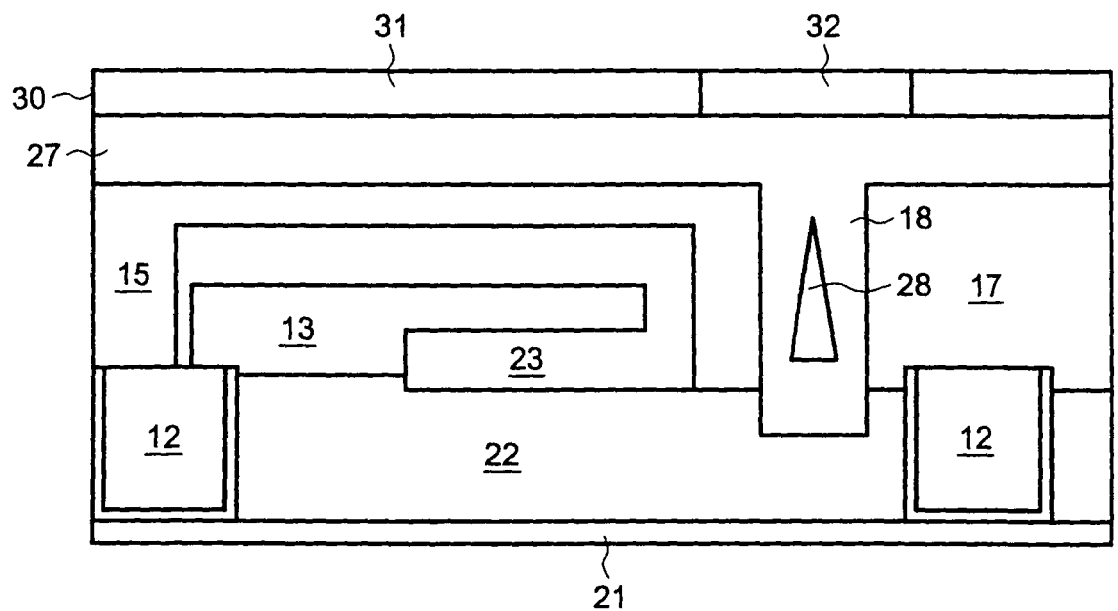
Figure 20:
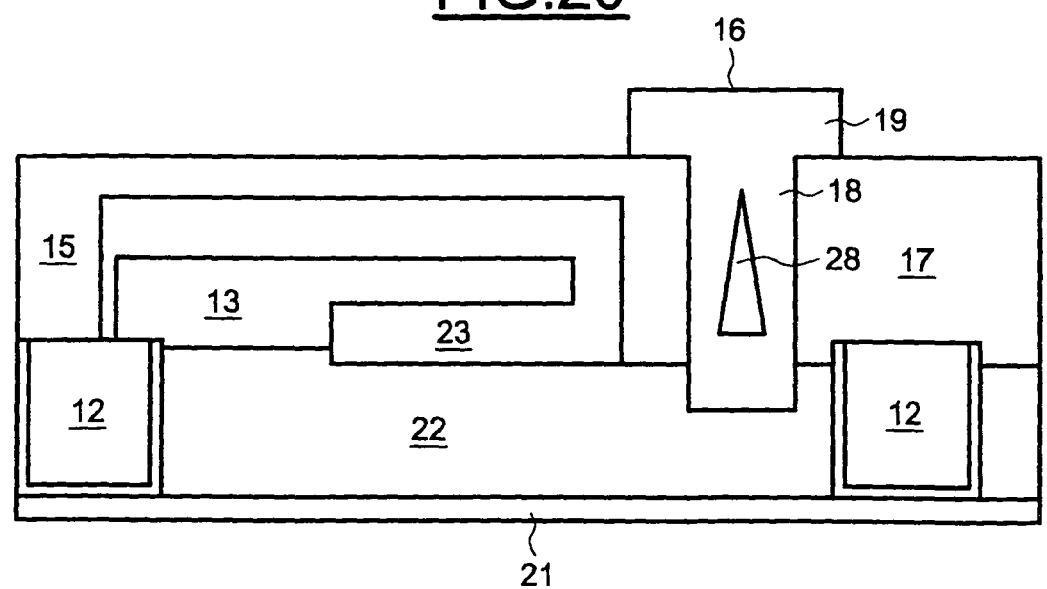
Figure 21:
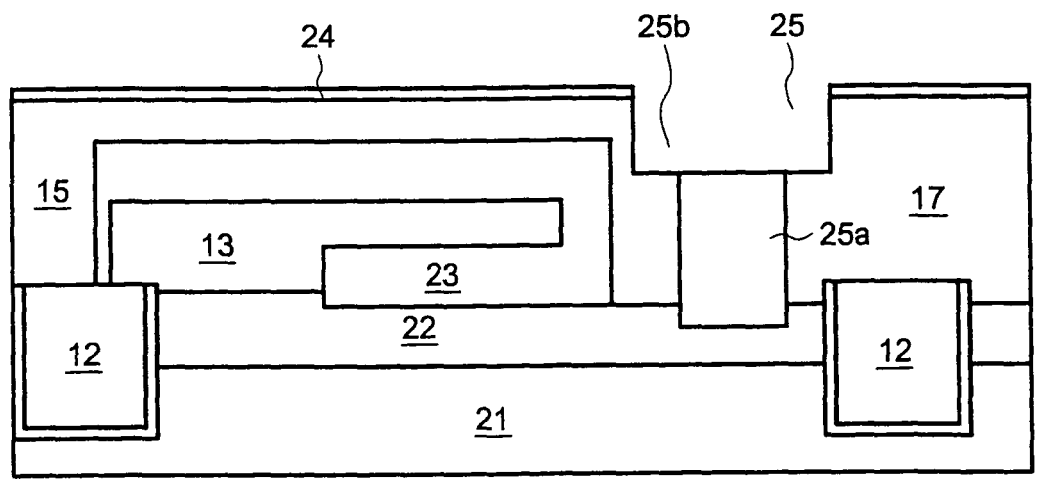
Figure 22:
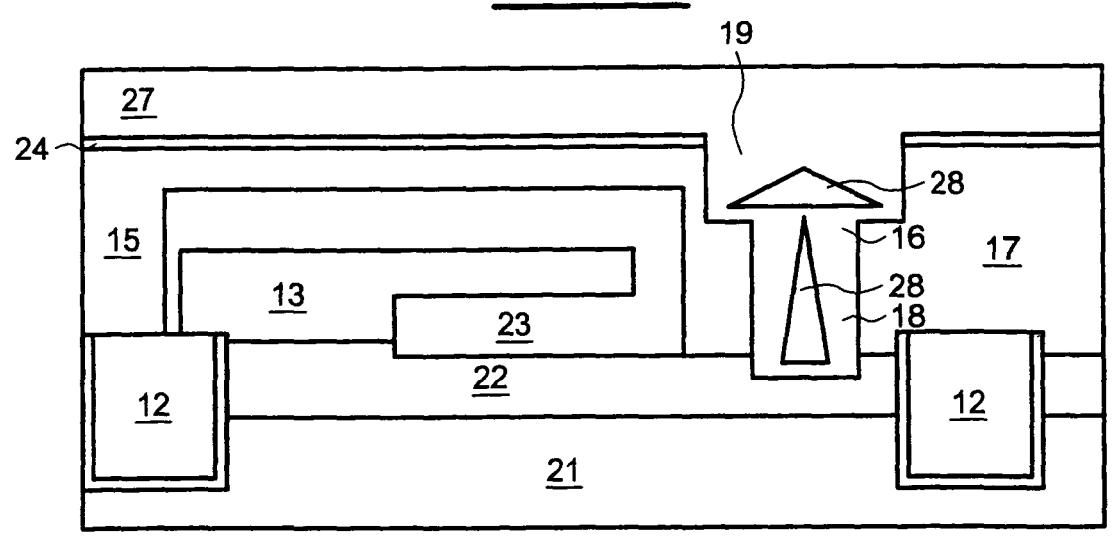
Figure 23:
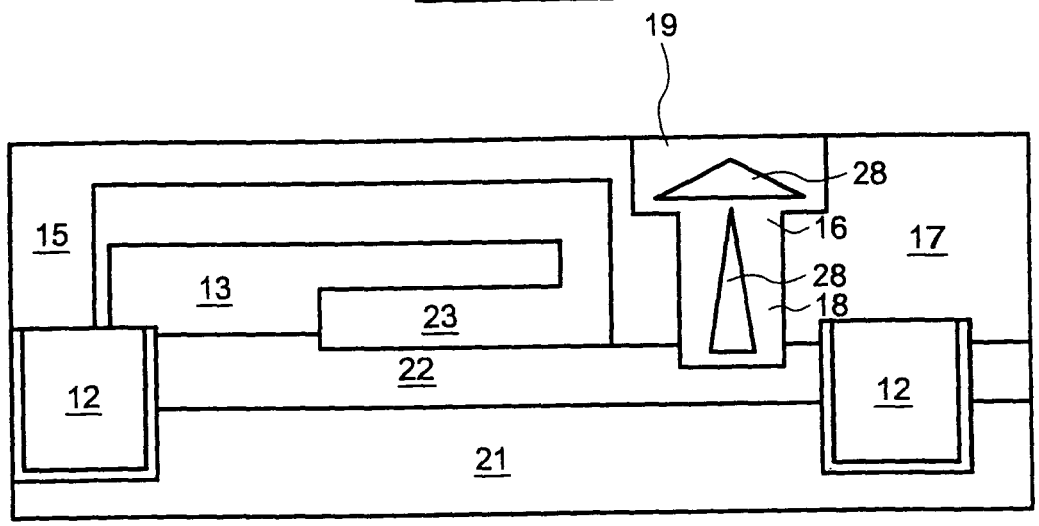
Figure 24:
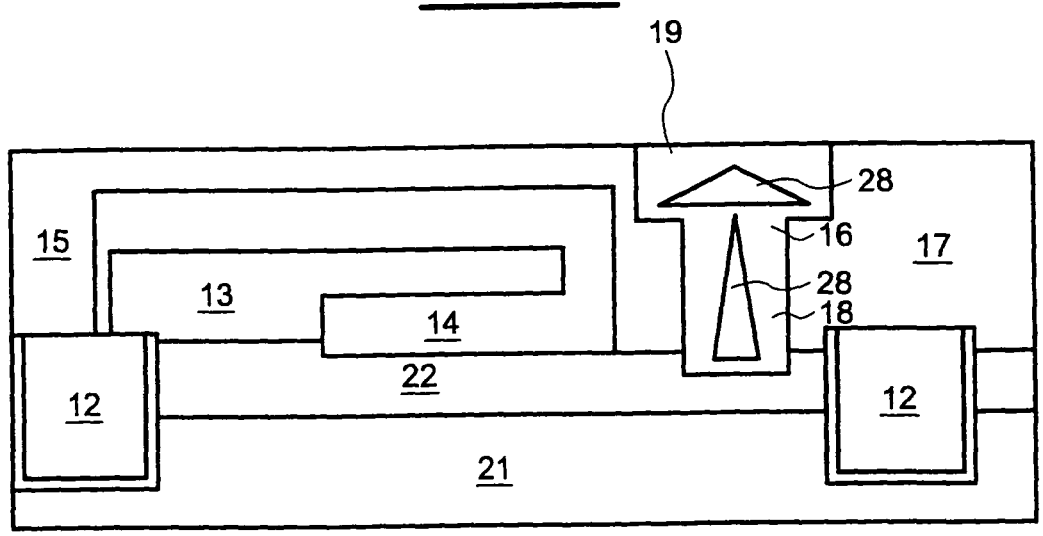
Figure 25:
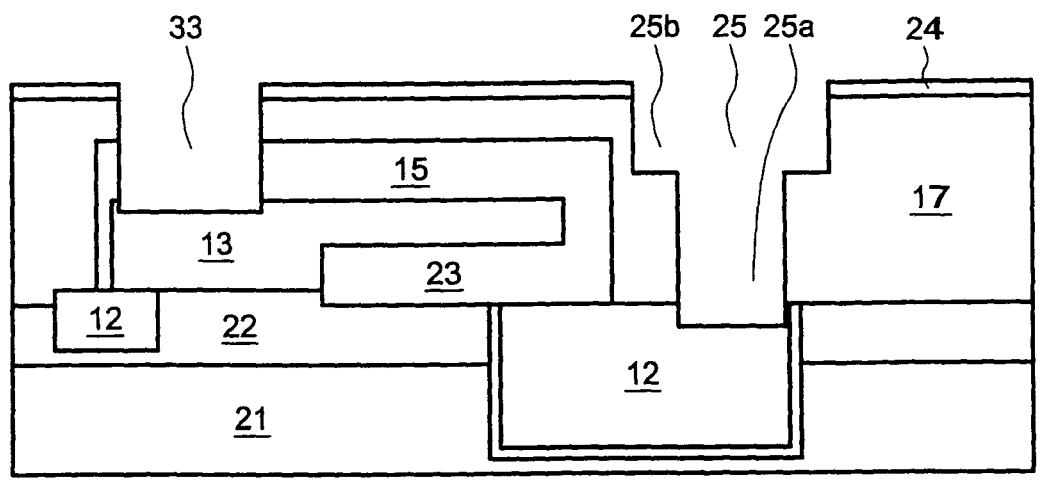
Figure 26:
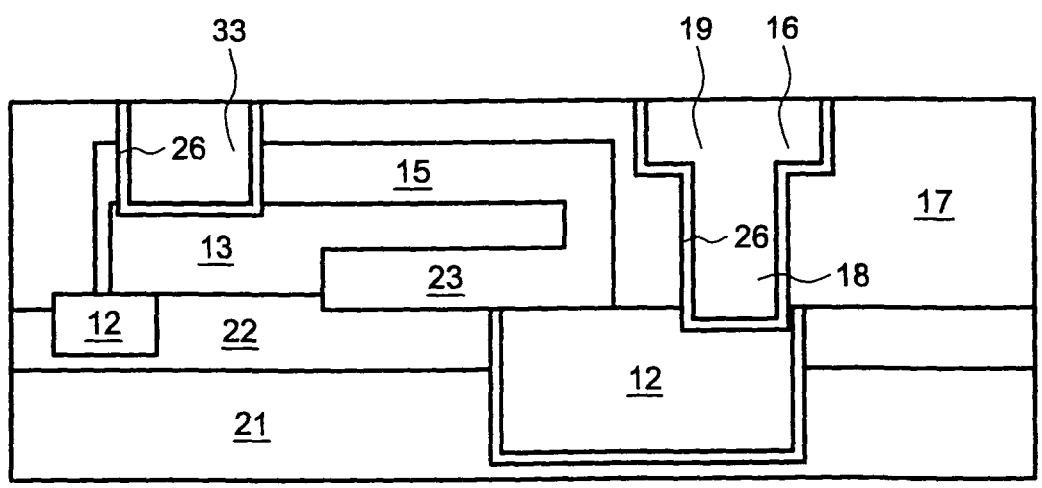
Figure 27:
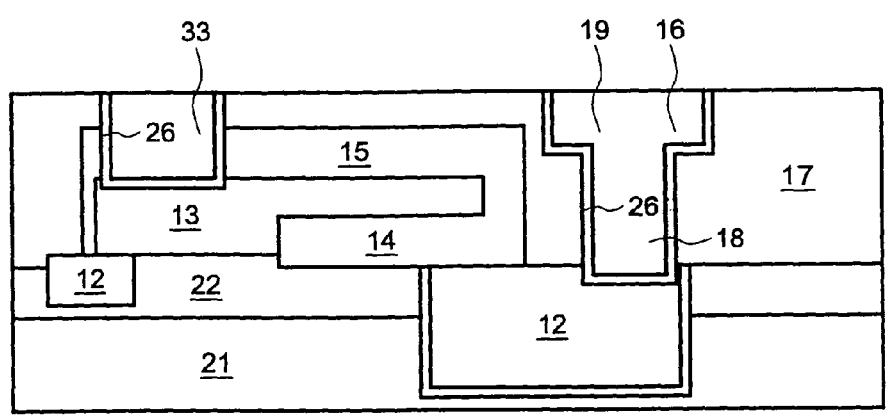

Other advantages and features of the invention will appear on examining the detailed description of embodiments, these being in no way limiting and of the appended drawings in which:

FIG. 1 illustrates diagrammatically a first embodiment of an integrated circuit, FIG. 2 illustrates diagrammatically a second embodiment of an integrated circuit, FIGS. 3 to 10 illustrate diagrammatically steps of manufacturing a circuit according to a first method, FIG. 11 shows a variant of FIG. 10, FIGS. 12 and 13 show two embodiments of a barrier, FIGS. 14 to 18 illustrates diagrammatically steps of manufacturing a circuit according to a second method, FIGS. 19 and 20 show a variant of the second method, FIGS. 21 to 24 illustrate diagrammatically steps of manufacturing a circuit according to a third method, and FIGS. 25 to 27 show a variant of the third method.

As shown on FIG. 1, an integrated circuit 1 includes a substrate 2 that may comprise Si or SOI (silicon on insulator), a contact level 3 on the substrate 2, interconnect levels 4 on the contact level 3, and an "above IC" level 5 on the interconnect levels 4. The "above IC" level 5 may comprise an active component, for example a micro-electromechanical system (MEMS).

The substrate 2 having an upper surface 2a includes a transistor 6 formed under the upper surface 2a. The transistor 6 may comprise an intrinsic base, an intrinsic source and an intrinsic drain. A shallow isolation trench 6a may be formed near the transistor 6 under the upper surface 2a of the substrate 2. The contact level 3 includes contacts 7 for the transistor 6. The contacts 7 may comprise an extrinsic base, an extrinsic source and an extrinsic drain. The interconnect levels 4 includes a plurality of metallization layers 8 comprising conductive lines 9 that may comprise copper or aluminium. The metalization layers 8 are isolated by dielectric layers 10 that may comprise $SiO_2$, SiON, SiN, SiC, etc. Each metallization layer 8 is formed on a dielectric layer 10 and under a dielectric layer 10. A dielectric layer 10 may comprise at least a via 11 connecting two metallization layers 8 separated by said dielectric layer 10. The interconnect levels 4 includes an upper metallization layer provided with large conductive lines 12.

The "above IC" level 5 includes an active component 13 that may comprise a resonator. The active component 13 may be a micro-electromechanical system. The component 13 is supported by the interconnect levels 4 within a cavity 14 formed in the "above IC" level 5. The cavity 14 forms a chamber delimitated by an upper surface of the interconnect levels 4, lateral surfaces and a ceiling. The lateral surfaces and the ceiling may be formed by a low dielectric region 15 comprising a low k organic polymer, for example SiLK. The "above IC" level 5 also includes a barrier 16 extending from the interconnect levels 4 to the top of the "above IC" level 5. The barrier 16 is formed around the cavity 14 and surrounds the low dielectric region 15. The barrier 16 may be continuous with the shape of a line, or discontinuous with the shape of line segments or of vias. Outside the barrier 16, the "above IC" level 5 may comprise a dielectric layer 17 made of the same material as the low dielectric region 15.

The barrier 16 includes a body 18 part extending from the interconnect levels 4 to the vicinity of the top or to the top of the "above IC" level 5, and a head part above 19 at least a part of the low dielectric region 15. The head part 19 retains the low dielectric region 15 on the interconnect levels 4 even if the low dielectric region 15 is not secured to the interconnect levels 4 by chemical links. In other terms, the barrier 16 forms a plug nailing the low dielectric region 15 on the interconnect levels 4. The low dielectric region 15 encapsulates the component 13 without contact so as to let the component 13 moving or vibrating.

The barrier 16 may comprise a conductive material for example copper or a dielectric material for example SiC, a material containing SiC, H enriched SiC, etc. The barrier 16 is made of material resistant to the process steps used for excavating the cavity.

As shown on FIG. 2, an integrated circuit 1 includes a substrate 2 that may comprise Si or SOI (silicon on isolant), a contact level 3 on the substrate 2, interconnect levels 4 on the contact level 3, and a component 13 arranged at the contact level 3 and supported by the substrate 2. The contact level 3 includes a cavity 14 formed in a low dielectric region 15. The component 13 lies within the cavity 14. A barrier 16 surrounds the dielectric region 15 and extends across the contact level 3 between the substrate 2 and the interconnect levels 4. The active component 13 is placed in the front end of the line.

The methods hereinafter described may be used to manufacture a barrier for a component 13 arranged on the substrate or on interconnect levels, directly or with an intermediary support layer.

Figure 3:
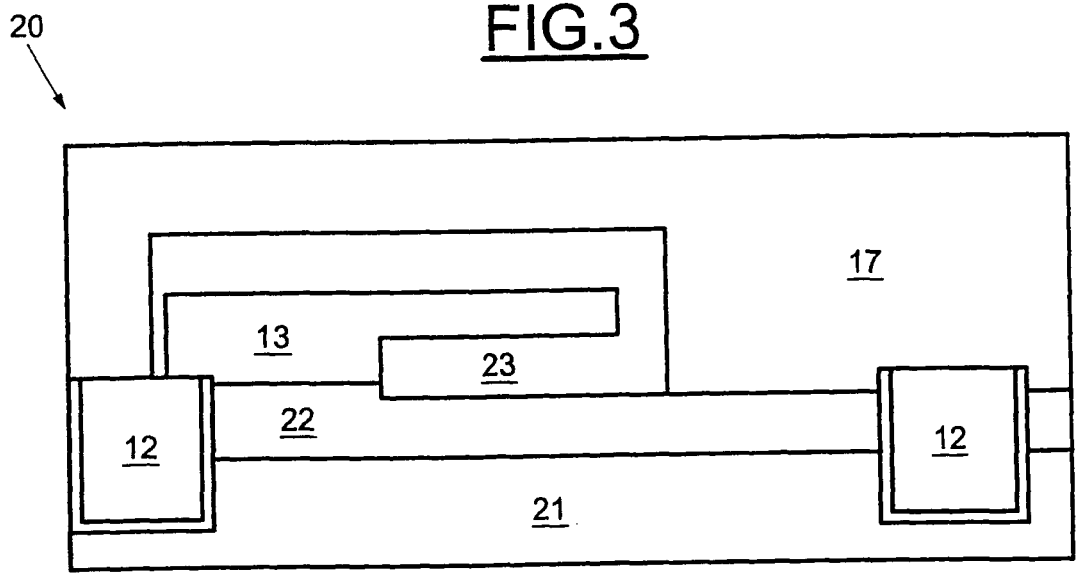

As shown on FIG. 3, a wafer 20 during manufacturing includes a first layer 21, a second layer 22 formed on the first layer 21, conductors 12 formed in the second layer 22 and in a part of the first layer 21, a component 13 supported by the second layer 22 and in contact with the conductor 12, a silicon glass region 23 formed around the component 13, and a low dielectric layer 17 formed on the second layer 22 and on the silicon glass region 23. The layer 17 may comprise parts thicker than the silicon glass region 23. The conductors 12 are covered by the low dielectric layer 17. The low dielectric layer 17 may be deposited on the complete surface of the wafer 20. The low dielectric layer 17 may include a low K material, for example SiLK material having a permittivity less than 3.

The component 13 may be formed by different steps including undoped silicon glass deposition, lithography and etch. The first layer 21 may be a metallization layer of interconnects levels or a substrate comprising silicon. The second layer 22 may be a dielectric layer, for example based on $SiO_2$, SiC, SiON, SiOC, etc. The silicon glass region 23 may comprise undoped silicon glass or fluorinated silicon glass. The wafer 20 is destinated to form an integrated circuit.

Afterwards, a thin SiC based layer 24 is deposited on the surface of the low dielectric layer 17. A trench 25 is excavated by etching the SiC based layer 24 and the low dielectric layer 17 until the second layer 22 is reached, see FIG. 4. The trench 25 may extend partially in an upper part of the second layer 22, see dotted lines. The trench 25 is arranged between the silicon glass region 23 and the conductors 12.

Figure 5:
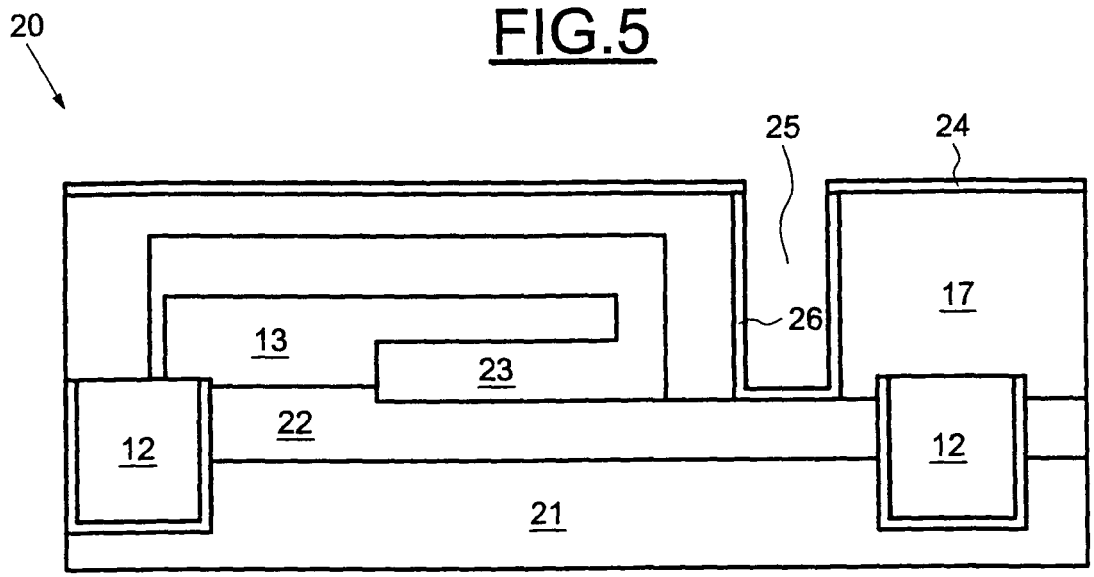
Figure 6:
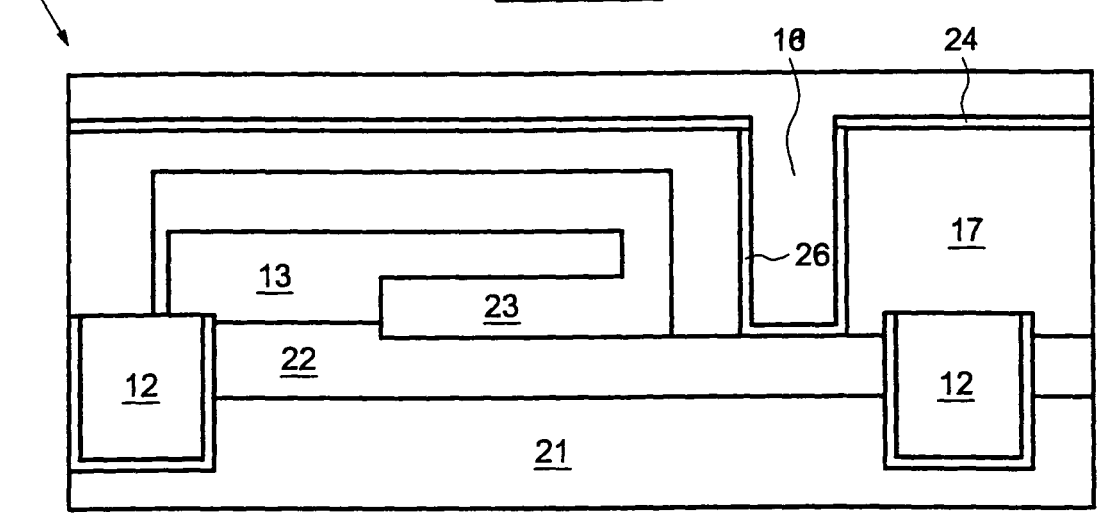
Figure 7:
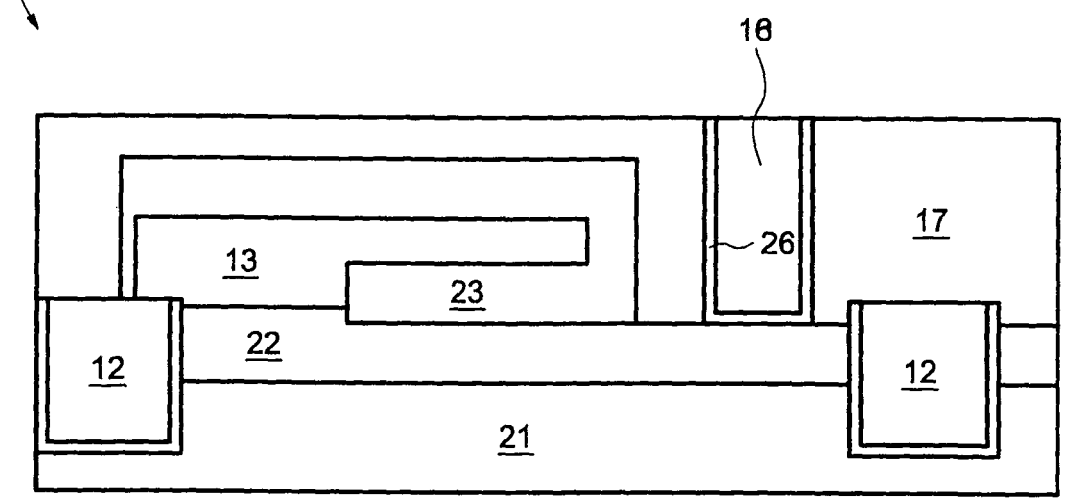

As shown on FIG. 5, the bottom and the lateral surfaces of the trench 25 are coated with a thin layer 26 that may comprise Ta, TaN, W, etc. Then the trench 25 is filled with a metal, for example copper made by an electrolytic process, see FIG. 6. The metal in excess covering the wafer 20 and the layer 17 outside the trench 25 is removed by a removing process such as CMP (chemical mechanical polishing). The metal forms the body part 18 of the barrier 16 and is flush with the upper surface of the low dielectric layer 17.

Of course, the trench may be filled directly with a metal without using a layer including SiC material.

Figure 8:
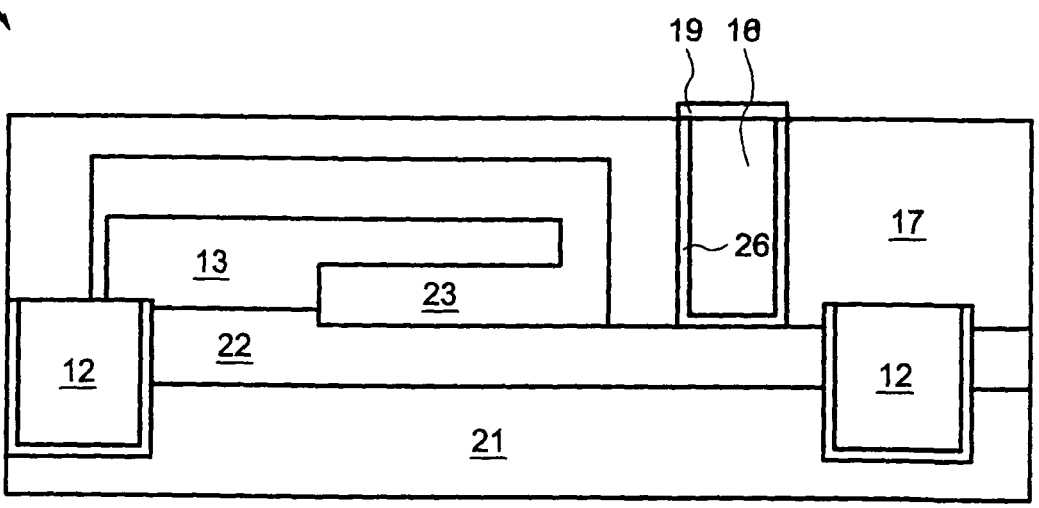
Figure 9:
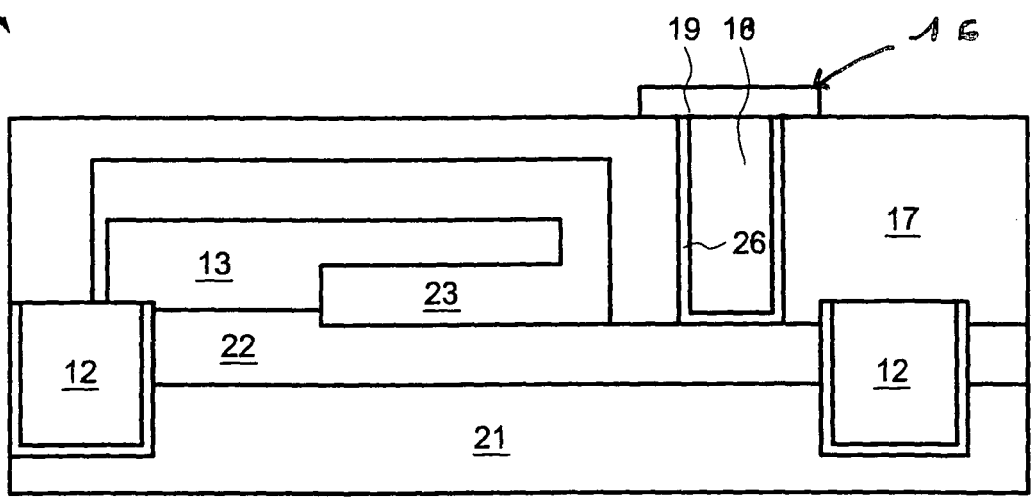

As shown on FIG. 8, a self aligned head part 19 is added to the barrier 16 above the body part 18, for example by an isotropic deposition process. The head part 19 may comprise W or Cu. W may be deposited by a CVD or PECVD process and may grow on copper but not on the low k layer 17. As the deposition may be substantially isotropic, the head part 19 may get a mushroom like shape as it becomes thicker. The head part 19 is larger than the body part 18, see FIG. 9, and prevents a possible low dielectric layer 17 lift off.

As shown on FIG. 10, the silicon glass region 23 is attacked by HF through the low dielectric layer 17. The silicon glass region 23 is removed so as to form the cavity 14 around the component 13. The interfaces between the low dielectric layer 17 and other elements such as the conductor 12 and the second layer 22 may be damaged by HF with a risk of loosening of the dielectric layer 17. However, the thin layer 26 between the metal of the body part 18 and the low dielectric layer 17 is not significantly damaged by the HF attack. The barrier 16 remains secured to the second layer 22. The head part 19 of the barrier 16 prevents separation of the low dielectric layer 17 from the second layer 22. As a consequence, the component 13 is packaged by the low dielectric layer 17.

An other embodiment is shown on FIG. 11 at the same step than FIG. 10. The component 13 may lie on a support 13a made of conductive material. The support 13a may comprise W, Cu, Al, etc. Starting from FIG. 7, the body part 18 of the barrier 16 is made of a material on which the same material can be deposited, for example tungsten. An isotropic deposition, for example a W CVD, is made. The head part 19 of the barrier 16 grows self aligned on the body part 18. The barrier 16 has a head part 19 integral with the body part 18.

As shown on FIG. 12, the barrier 16 may be line shaped with a length substantially greater than the width. An excellent protection against the HF attack is obtained.

As shown on FIG. 13, the barrier 16 may be via shaped with a length substantially equal to or smaller than the width. The barrier 16 having the shape of a via of an interconnect level may also be used as a via so as to conduct electricity. The barrier 16 may allow electrical connections between the substrate 2 and the interconnect levels 4, see FIG. 2, or between the interconnect levels 4 and conductors 12 arranged above the circuit 1, see FIG. 1. The barrier 16 may have a double function of mechanical stabilizer of the Silk region 15 and of electrical conductor for signals or energy.

Figure 4:
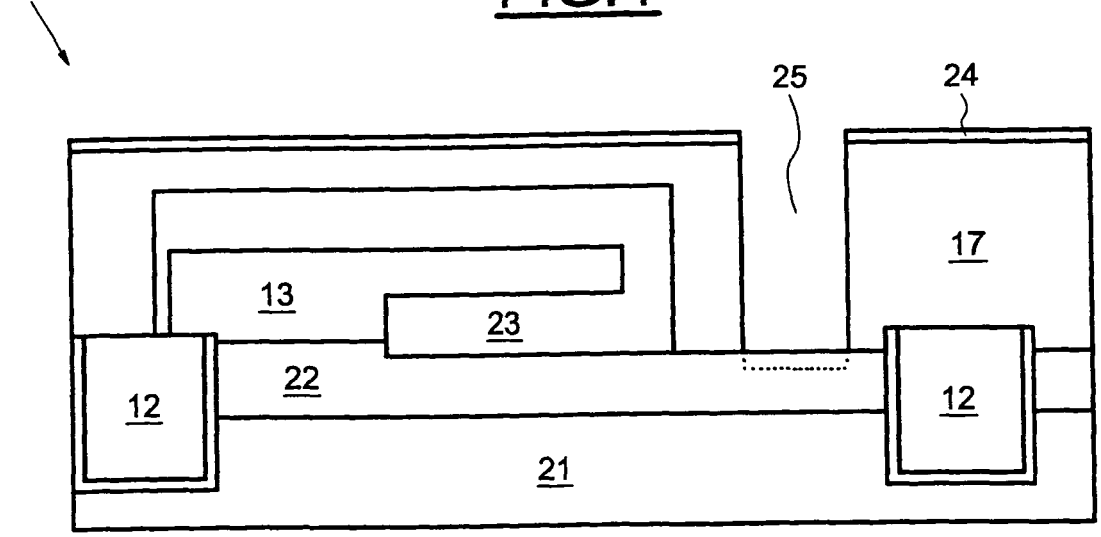

A second method of manufacturing the circuit 1 comprises the step of depositing the thin layer 24 on the wafer 20 of FIG. 3 and forming the trench 25 as shown on FIG. 4. The second layer 22 may be partially etched so that the trench 25 extends partially in the second layer 22. The thin layer 24 may include SiC or undoped silicon glass. Afterwards, a thick SiC based layer 27 is deposited, for example by CVD. The deposition is isotropic. The trench 25 is partially filled with SiC so as to form the body part 18 of the barrier 16, while an internal cavity 28 may remain or not in the body part 18, see FIG. 14. The internal cavity 28 may contain air. The thick SiC based layer 27 and the thin layer 24 above the low dielectric layer 17 are removed by an etching or CMP process. The trench 25 remains filled, see FIG. 15, the body part 18 being flush with the top surface of the SiLK layer 17.

Figure 16:
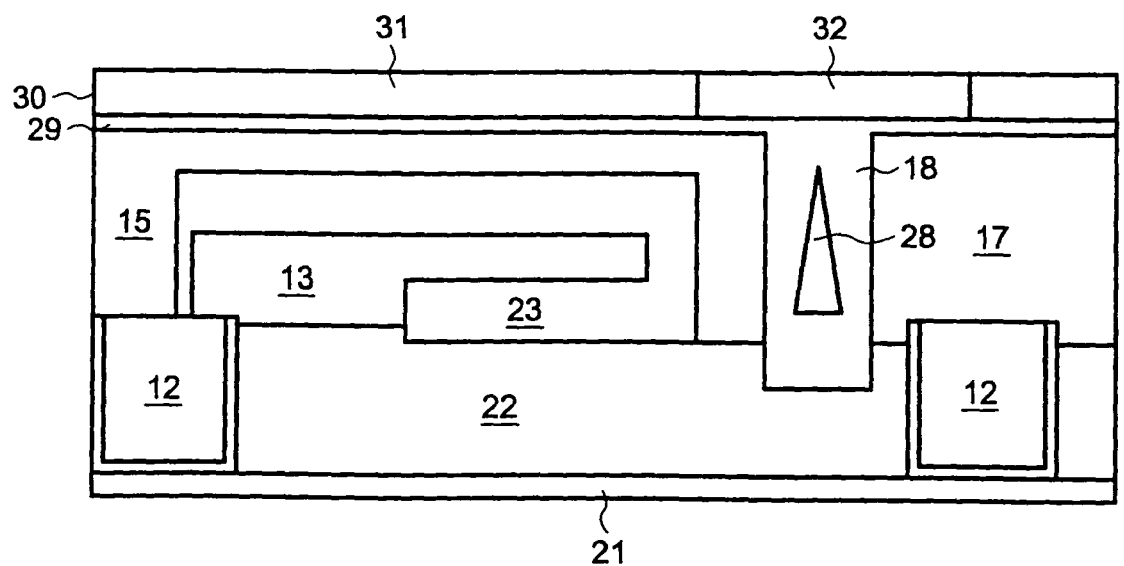
Figure 17:
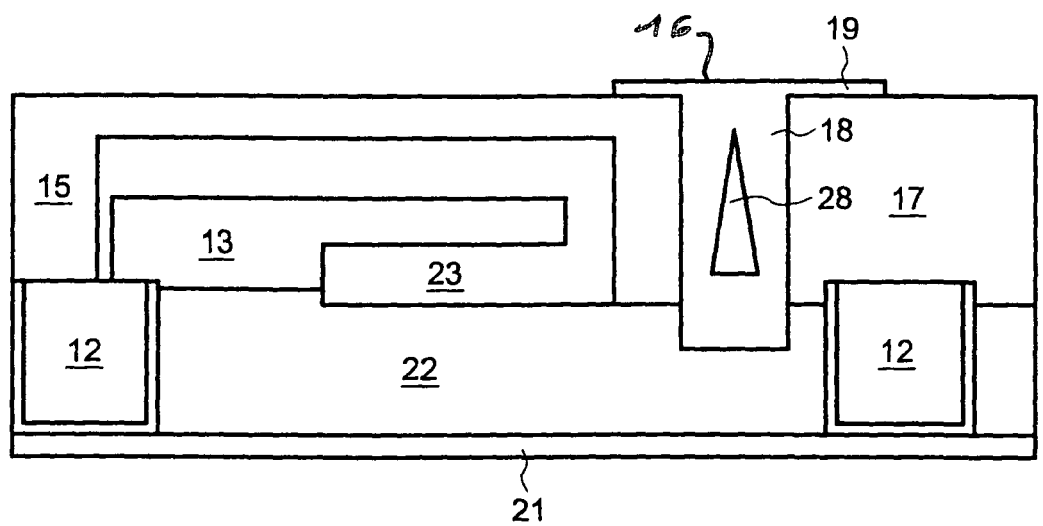

As shown on FIG. 16, a thin layer 29 that may comprise SiC is deposited on the whole wafer surface and a resist layer 30 is deposited on the thin layer. The resist layer 30 is exposed to define etching areas 31 and non etching areas 32 corresponding to a region larger than the body part 18 of the barrier 16. The thin layer 29 is etched and completely removed on the major part of the wafer. The remaining part of the thin layer 29 under the previous non etching area 32 forms the head part 19 of the barrier 16, see FIG. 17. The barrier 16 comprises a body part 18 and a head part 19 made of the same material that may be dielectric. The dielectric properties of the circuit are substantially maintained despite the barrier 16. The head part 19 is strongly fixed to the body part 18 owing to the step of depositing a head part 19 of substantially the same material as the body part 18.

As shown on FIG. 18, the silicon glass region 23 is removed by a HP attack. The body part 18 of the barrier 16 is strongly fixed in the second layer 22 by the protrusion of said body part 18 within said second layer 22 that have been overetched when excavating the trench 25. The interface between the second layer 22 and the barrier 16 may be preserved. The SiC material of the barrier 16 is HF resistant. The mushroom like shape of the barrier 16 with a head part 19 larger than the body part 18 allows maintaining the low dielectric region 15. In other terms, the barrier 16 nails the low dielectric region 15 to the second layer 22. The SILK region 15 is a part of the SILK layer 22 around the cavity 14.

As shown on FIG. 19, the thick layer 27 deposited on the wafer is used to form the whole barrier. The resist layer 30 is deposited on the thick layer 27. The resist layer 30 is exposed to define etching areas 31 and non etching areas 32 corresponding to a region larger than the body part 18 of the barrier 16. The thick layer 27 is etched and completely removed on the major part of the wafer 20. The remaining part of the thick layer 27 under the previous non etching areas 32 forms the head part 19 of the barrier 16, see FIG. 20. The body part 18 is integral with the head part 19.

A third method of manufacturing the circuit 1 comprises a dual damascene process to define and open the trench 25. As shown on FIG. 21, a staged trench 25 is excavated from the upper surface of a thin layer 24 covering the low dielectric layer 17. The second layer 22 may be partially etched so as to form the bottom of the trench 25. The trench comprises a narrow part 25a near the second layer 22 and a large part 25b near the thin layer 24. The wafer 20 is covered by a thick layer 27 that may comprise SiC or H enriched SiC, see FIG. 22. The trench 25 is filled at least partially with the material of the thick layer 27. Internal cavities 28 containing air may remain or not in the trench 25. The thick layer 27 and the thin layer 24 are removed from above the low dielectric layer 17, for example by an etching process or by CMP. The material of the thick layer 27 remains in the trench 25, thus forming the barrier 16, see FIG. 23. In other terms, the barrier 16 includes a body portion 18 in the narrow part 25a and the head portion 19 in the large part 25b. The body portion 18 is secured directly to the second layer 22. The head portion 19 retains the low dielectric region 15 as the head of a nail.

As shown on FIG. 24, the silicon glass region 23 is removed by a HF attack. The interface between the second layer 22 and the barrier 16 may be preserved. The material of the barrier 16 is HF resistant.

As shown on FIG. 25, the wafer 20 comprises a staged trench 25 excavated from the upper surface of a thin layer 24 covering the SiLK layer until a conductor 12, for example comprising copper, lying flush with the second layer 22. Alternatively, the conductor 12 may be arranged under the top surface of the second layer 22. The wafer 20 comprises a supplementary trench 33 etched across the thin layer 24, the low dielectric region 15 and the oxide silicon layer 23 until the component 13 is reached. Afterwards, a thin layer 26 corresponding to the layer of FIG. 5 is formed in the trenches 25, 33. The thin layer 26 may comprise SiC or H enriched SiC. The trenches 25, 33 are filled with a conductive material, for example copper, see FIG. 26. The wafer 20 may be planarized and the thin layer 24 removed by CMP. The filled staged trench 25 forms a barrier 16 nailing the low dielectric region 15 and a via connecting the conductor 12 upwards. The filled supplementary trench 33 forms a via connecting the component 13 upwards. The filled trenches 25, 33 may also be used as dummies to have a substantially constant rate of metal in the low dielectric layer 17.

As shown on FIG. 27, the silicon glass region 23 is removed by a HF attack. The interface between the conductor 12 and the barrier 16 may be preserved. The material of the thin layer 26 and the conductive material filling the trenches are HF resistant. The barrier 16 may prevent HF to diffuse outside the cavity 14 and the low dielectric region 15.

In other terms, the silicon oxide region may be removed through the low dielectric region. The nail maintains the low dielectric region on its support. The component, the nail and the second layer under the cavity may remain substantially unaffected by the removal step. Removal resistant materials for the nail may comprise SiC, Cu, Ti, TiN, Ta, TaN, W, etc. The invention allows the use of organic polymers for the top layer of a cavity in which an active component is arranged. The integration of active components, such as MEMS, is made easier.

The invention provides cheap and efficient methods for manufacturing a component 13 in a cavity 14 surrounded by a packaging layer. The invention is particularly advantageous for packaging active components having movable parts, for example a MEMS. The risk of separation of the packaging layer from the support is greatly reduced. The rate of faulty wafers may be reduced. The integrated circuit is more robust and reliable.

The invention claimed is:

1. Method of manufacturing an integrated circuit, said method comprising the steps of:
   forming an active component above a substrate;
   forming a low dielectric region above the substrate, wherein at least a portion of the low dielectric region is disposed above the active component;
   forming a protective barrier around the low dielectric region, wherein forming the protective barrier comprises forming at least a trench in the low dielectric region, depositing a thin dielectric layer in the trench, and filling a remainder of the trench with a metal; and
   forming a cavity surrounding partially the active component, the low dielectric region partially surrounding the cavity, wherein the cavity is formed through excavation and filled with a gas, the low dielectric region comprising a porous material such that the excavation comprises chemically attacking a removable region in the cavity through the low dielectric region.

2. Method according to claim 1, wherein a removable region is formed around the active component and the low dielectric region is formed around the removable region.

3. Method according to claim 1, wherein forming the protective barrier comprises at least partially filling the trench with a dielectric material.

4. Method according to claim 1, wherein forming the protective barrier comprises forming an upper part larger than a base part, the upper part being above the low dielectric region, the base part being at the level of the low dielectric region.

5. The method according to claim 4, wherein the upper part is formed by an isotropic deposition process.

6. Method according to claim 1, wherein the protective barrier is formed by a dual damascene process.

7. Method according to claim 1, wherein the protective barrier comprises material resistant to the step of forming a cavity.

8. A method of manufacturing an integrated comprising:
   forming an active component above a substrate;
   forming a low dielectric region above the substrate, wherein at least a portion of the low dielectric region is disposed above the active component, the low dielectric region formed of a porous material;
   forming a protective barrier around the low dielectric region, wherein forming the protective barrier comprises forming at least a trench in the low dielectric region, depositing a thin dielectric layer in the trench, and filling a remainder of the trench with a metal; and
   forming a cavity partially surrounding the active component, the low dielectric region partially surrounding the cavity, wherein the cavity is formed through excavation and filled with a gas, the low dielectric region comprising a porous material such that the excavation comprising chemically attacking a removable region in the cavity through the low dielectric region.

9. The integrated circuit integrated circuit according to claim 8, wherein a removable region is formed around the active component and the low dielectric region is formed around the removable region.

10. The integrated circuit according to claim 8, wherein forming the protective barrier comprises forming an upper part larger than a base part, the upper part being above the low dielectric region, the base part being at the level of the low dielectric region.

11. The integrated circuit according to claim 10, wherein the upper part is formed by an isotropic deposition process.

12. The integrated circuit according to claim 8, wherein the protective barrier comprises material resistant to the step of forming a cavity.

13. The integrated circuit according to claim 8, wherein the protective barrier is formed by a dual damascene process.

* * * * *